(12) United States Patent
Nandi et al.

(10) Patent No.: US 10,948,933 B2
(45) Date of Patent: Mar. 16, 2021

(54) DIGITAL-TO-ANALOG CONVERTER POWER-UP CONTROL

(71) Applicant: TEXAS INSTRUMENTS INCORPORATED, Dallas, TX (US)

(72) Inventors: Gautam Salil Nandi, Bengaluru (IN); Mit Bhattacharya, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/386,637

(22) Filed: Apr. 17, 2019

(65) Prior Publication Data

US 2020/0333814 A1 Oct. 22, 2020

(51) Int. Cl.
*G05F 1/46* (2006.01)
*G05F 1/575* (2006.01)
*H03M 1/78* (2006.01)

(52) U.S. Cl.
CPC .............. *G05F 1/468* (2013.01); *G05F 1/575* (2013.01); *H03M 1/785* (2013.01)

(58) Field of Classification Search
CPC ......... G05F 1/468; G05F 1/575; H03M 1/785
USPC ....................................................... 341/154
See application file for complete search history.

(56) References Cited

U.S. PATENT DOCUMENTS

| 7,336,211 | B1 * | 2/2008 | Lai | H03M 1/06 341/118 |
| 7,616,144 | B2 * | 11/2009 | Mulder | H03K 17/04106 341/118 |
| 10,324,201 | B2 * | 6/2019 | Groepl | G01T 1/249 |

\* cited by examiner

*Primary Examiner* — Brian K Young
(74) *Attorney, Agent, or Firm* — John R. Pessetto; Charles A. Brill; Frank D. Cimino (57) ABSTRACT

A digital-to-analog converter includes a resistor ladder, a first switch and a protection circuit. The first switch includes a first terminal and a second terminal that are respectively coupled to a rung of the resistor ladder and a reference voltage node. The protection circuit is coupled to the reference voltage node and to a reference voltage input terminal. The protection circuit includes a second switch, a third switch, and a fourth switch. First and second terminals of the second switch are respectively coupled to the reference voltage node and the reference voltage input terminal. First and second terminals of the third switch are respectively coupled to the reference voltage node and a reference voltage feedback terminal. The first and second terminals of the fourth switch are respectively coupled to the reference voltage input terminal and the reference voltage feedback terminal.

20 Claims, 7 Drawing Sheets

DIGITAL-TO-ANALOG CONVERTER POWER-UP CONTROL

BACKGROUND

Many electronic systems include circuits that convert digital signals to analog signals. Such circuits are referred to as digital-to-analog converters. Digital-to-analog converters can be implemented in a variety of ways. One type of digital-to-analog converter includes an R-2R resistor ladder in which multiple bits of a digital value are selectively provided to the resistor ladder via switches to generate an output voltage having an amplitude that corresponds to the value of the digital value. The R-2R ladder includes a "runner" of series-connected resistors, each having a resistance of R ohms, and a plurality of "rungs," one for each binary bit of the digital value, Each rung includes a resistor of 2R ohms. A voltage reference is placed across the R-2R ladder producing binary-weighted currents that are summed and converted into an output voltage.

SUMMARY

A digital-to-analog converter that includes power up control to reduce output transients and protect the switches coupled to a resistor ladder is disclosed herein. In one example, a digital-to-analog converter includes a resistor ladder, a first switch and a protection circuit. The first switch includes a first terminal and a second terminal. The first terminal is coupled to a rung of the resistor ladder. The second terminal is coupled to a reference voltage node. The protection circuit is coupled to the reference voltage node and to a reference voltage input terminal. The protection circuit includes a second switch, a third switch, and a fourth switch. The second switch includes a first terminal and a second terminal. The first terminal is coupled to the first reference voltage node. The second terminal is coupled to the reference voltage input terminal. The third switch includes a first terminal and a second terminal. The first terminal of the third switch is coupled to the reference voltage node. The second terminal of the third switch is coupled to a reference voltage feedback terminal. The fourth switch includes a first terminal and a second terminal. The first terminal of the fourth switch is coupled to the reference voltage input terminal. The second terminal of the fourth switch is coupled to the reference voltage feedback terminal.

In another example, an integrated circuit includes a digital-to-analog converter. The digital-to-analog converter includes a resistor ladder, a first switch, a second switch, a first reference voltage input terminal, a second reference voltage input terminal, a first protection circuit, a second protection circuit, and power-up control circuitry. The first switch is configured to switchably couple a first reference voltage node to a rung of the resistor ladder. The second switch configured to switchably couple a second reference voltage node to the rung of the resistor ladder. The first reference voltage input terminal is configured to receive a first reference voltage. The second reference voltage input terminal is configured to receive a second reference voltage. The first protection circuit is coupled to the first reference voltage node and the first reference voltage input terminal. The first protection circuit includes a third switch and a fourth switch. The third switch is configured to switchably couple the first reference voltage node to the first reference voltage input terminal through a first resistor. The fourth switch is configured to switchably couple the first reference voltage node to the first reference voltage input terminal. The second protection circuit is coupled to the second reference voltage node and the second reference voltage input terminal. The second protection circuit includes a fifth switch and a sixth switch. The fifth switch is configured to switchably couple the second reference voltage node to the second reference voltage input terminal through a second resistor. The sixth switch is configured to switchably couple the second reference voltage node to the second reference voltage terminal. The power up control circuitry configured to close the third switch and the fifth switch, and open the fourth switch and the sixth switch during a power-up interval; and close the fourth switch and the sixth switch after expiration of the power-up interval.

In a further example, a method for powering-up a digital-to-analog converter is performed in a digital-to-analog converter that includes a resistor ladder, a first switch configured to switchably couple a first reference voltage node to a rung of the resistor ladder, and a second switch configured to switchably couple a second reference voltage node to the rung of the resistor ladder. The method includes, in a power-up interval: closing a third switch to couple the first reference voltage node to a first reference voltage input terminal through a first resistor; and closing a fourth switch to couple the second reference voltage node to a second reference voltage input terminal through a second resistor. The method also includes, in the power-up interval: opening a fifth switch that couples the first reference voltage node to the first reference voltage input terminal; and opening a sixth switch that couples the second reference voltage node to the second reference voltage input terminal. The method further includes closing, after expiration of the power-up interval, the fifth switch and the sixth switch.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Some applications require a digital-to-analog converter (DAC) with an output voltage range greater than 5 volts (e.g., up to 30 volts). Such a DAC can be implemented in a variety of ways. For example, a low voltage DAC core may be followed by a high gain buffer to produce the high output voltage range. However, such as arrangement is not desirable in applications where low noise is an important consideration (e.g., signal generation in test and measurement equipment). Other implementations use a high-voltage (HV) R-2R ladder. HV R-2R ladder DACs include metal oxide semiconductor (MOS) switches for both the high and low side reference voltages. Some HV R-2R ladder DACs implement the switches using thick gate drain-extended transistors. The area and on resistance of the thick gate transistors is very high, which is undesirable. Furthermore, these DAC architectures may generate a substantial transient at the output when powered on.

The DACs disclosed herein use negative MOS (NMOS) low-voltage drain-extended transistors to implement the R-2R ladder drive switches. Use of low-voltage drain-extended transistors significantly reduces circuit area but the transistors are subject to damage due to transient voltages during circuit power-up. The DACs of this disclosure include protection circuits that control the voltages provided to the R-2R ladder drive switches during power up to prevent damage to the switches. The protection circuits also inhibit the generation of a transient at the output of the DAC during power-up.

Figure 1:
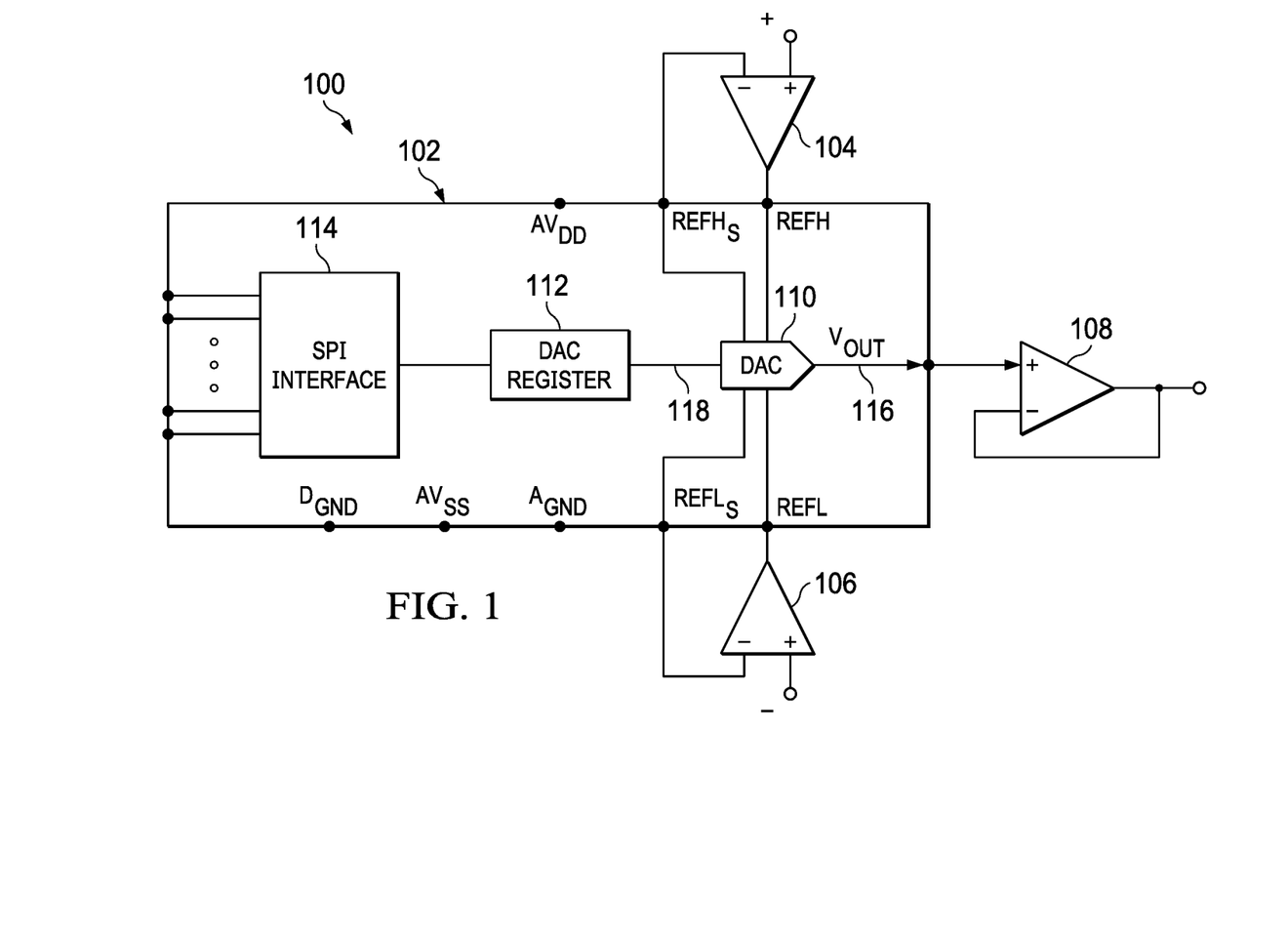
FIG. 1 shows a block diagram for an example integrated circuit that includes a digital-to-analog converter in accordance with the present disclosure.

FIG. 1 shows a block diagram for an example system 100 that includes a DAC in accordance with the present disclosure. The system 100 includes an integrated circuit 102, an operational amplifier 104, an operational amplifier 106, and an operational amplifier 108. The integrated circuit 102 includes a DAC 110, a register 112, and a communication interface circuit 114. The register 112 is coupled to the DAC 110, and stores a digital value for conversion to an analog signal by the DAC 110. The register 112 may include any number of storage cells (e.g., flip-flops) in various implementations of the integrated circuit 102. The communication interface circuit 114 is coupled to the register 112, and includes circuitry for receiving digital values from circuits external to the integrated circuit 102, where the digital values are to be converted to an analog signal by the DAC 110. The communication interface circuit 114 may be implemented as a serial peripheral interface (SPI) slave circuit or other serial communication protocol interface in implementations of the integrated circuit 102.

The DAC 110 receives the digital value 118 stored in the register 112 and produces an analog signal proportional to the digital value 118. The DAC 110 is coupled to the operational amplifier 104 and the operational amplifier 106. The DAC 110 receives a positive reference voltage from the operational amplifier 104, and receives negative reference voltage from the operational amplifier 106 for use in converting the digital value 118 received from the register 112 to an analog signal. The analog signal produced by the DAC 110 is buffered by the operational amplifier 108. The reference voltages provided to the DAC 110 may be relatively high (e.g., +1-15 volts). To reduce circuit area, the DAC 110 includes switches, based on NMOS thin-gate drain extended transistors, that are susceptible to damage when the integrated circuit 102 is powered up. The DAC 110 includes circuitry to control the application of voltage to the switches during power-up, and thereby protect the switches from damage. The DAC 110 also includes circuitry that prevents the generation of a transient at the output of the DAC 110 during power-up.

Figure 2:
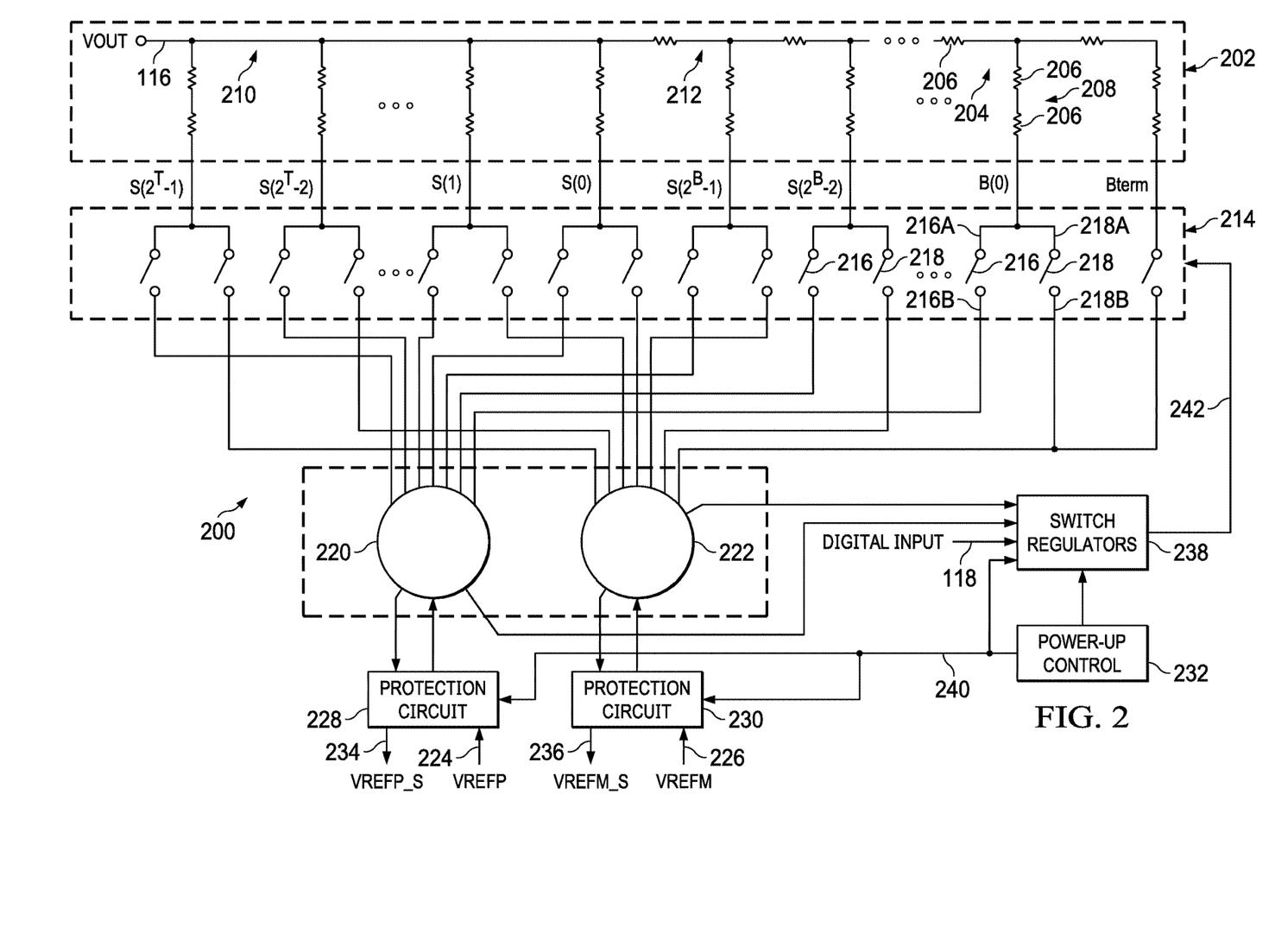
FIG. 2 shows a block diagram for an example digital-to-analog converter in accordance with the present disclosure.

FIG. 2 shows a block diagram for an example DAC 200 in accordance with the present disclosure. The DAC 200 is an implementation of the DAC 110. The DAC 200 includes a resistor ladder 202, switches 214, a reference voltage node 220, a reference voltage node 222, protection circuit 228, a protection circuit 230, a power-up control circuit 232, switch regulator circuitry 238. The resistor ladder 202 includes a runner 204 and a number of rungs 208. Each rung 208 includes resistors 206 providing resistance of 2R, and at least a portion of the runner 204 includes a resistor 206 connected between the rungs 208 and providing resistance of R. The implementation of the resistor ladder 202 shown in FIG. 2 is segmented. That is, a first portion 212 of the resistor ladder 202 is an R-2R ladder where the runner 204 includes a resistor 206 between the rungs 208, and in a second portion 210 of the resistor ladder 202 lacks a resistor 206 in the runner 204. Some implementations of the resistor ladder 202 may have a different resistor ladder arrangement.

The rungs 208 of the resistor ladder 202 are coupled to the switches 214. For each rung 208 of the resistor ladder 202, the switches 214 includes a switch 216 that couples the rung 208 to a positive reference voltage, and a switch 218 that couples the rung 208 to a negative reference voltage. The switch 216 includes a terminal 216A that is coupled to the rung 208 and a terminal 216B that is coupled to the reference voltage node 220. The switch 218 includes a terminal 218A that is coupled to the rung 208 and a terminal 218B that is coupled to the reference voltage node 222. The reference voltage node 220 is coupled to each of the switches 216, and the reference voltage node 222 is coupled to each of the switches 218. The switch 216 and the switch 218 are NMOS thin-gate drain extended transistors in some implementations of the switches 214.

The reference voltage node 220 is coupled to the protection circuit 228, and the reference voltage node 222 is coupled to the protection circuit 230. The protection circuit 228 and the protection circuit 230 control the voltages provided to the reference voltage node 220 and reference voltage node 222 to prevent damage to the switches 214 at power-up. The protection circuit 228 and the protection circuit 230 are coupled to the power-up control circuit 232. The power-up control circuit 232 controls the protection circuit 228 and the protection circuit 230 during power-up. For example, the power-up control circuit 232 may include circuitry that generates signals 240 to control how the protection circuit 228 and the protection circuit 230 pass the reference voltages to the reference voltage node 220 and the power-up control circuit 232 during power-up.

Operation of the switch 216 and the switch 218 is controlled by the switch regulator circuitry 238. For example, the switch regulator circuitry 238 generates a control signal for each switch 216 and switch 218. The control signal is based on the digital value 118 received from the register 112 and is provided as a voltage suitable for opening or closing the switch 216 or switch 218. The switch regulator circuitry 238 is coupled to the power-up control circuit 232. The power-up control circuit 232 controls the operation of the switch regulator circuitry 238 at power-up to prevent damage to the switch 216 and the switch 218, and to prevent generation of a transient at the output of the DAC 110 of the DAC 200 during power-up.

Figure 3:
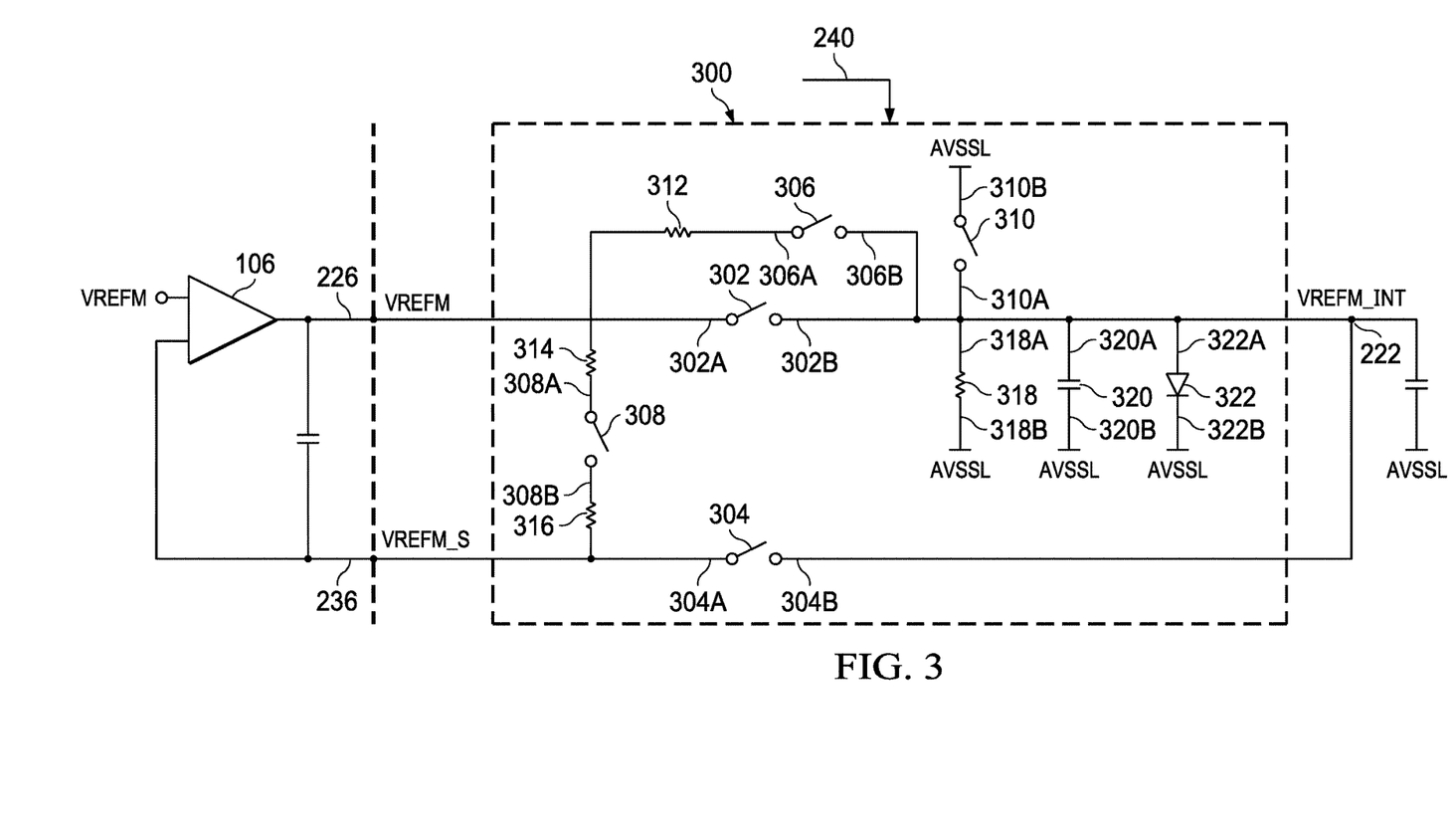
FIG. 3 shows a block diagram for an example protection circuit for a low-side reference voltage in accordance with the present disclosure.

FIG. 3 shows a block diagram for an example protection circuit 300 for a low-side reference voltage in accordance with the present disclosure. The protection circuit 300 is an implementation of the protection circuit 230. The protection circuit 300 includes switch 302, switch 304, switch 306, switch 308, switch 310, resistor 312, resistor 314, resistor 316, resistor 318, capacitor 320, and diode 322. The switches 302-310 are controlled by the signals 240 generated by the power-up control circuit 232.

The switch 302 couples the negative reference voltage input terminal 226 to the reference voltage node 222. The switch 304 couples the negative reference voltage feedback terminal 236 to the reference voltage node 222. The switch 302 includes a terminal 302A that is coupled to the negative reference voltage input terminal 226 and a terminal 302B that is coupled to the reference voltage node 222. The switch 304 includes a terminal 304A that is coupled to the negative reference voltage feedback terminal 236 and a terminal 304B that is coupled to the reference voltage node 222. The switch 306 couples the negative reference voltage input terminal 226 to the reference voltage node 222 via the resistor 312, which connected in series with the switch 306. The switch 306 includes a terminal 306A that is coupled to the negative reference voltage input terminal 226, via the resistor 312, and a terminal 306B that is coupled to the reference voltage node 222.

The switch 308 provides a path for feedback from the negative reference voltage input terminal 226 to the negative reference voltage feedback terminal 236 via the resistor 314 and resistor 316, which are connected in series with the switch 308. The switch 308 includes a terminal 308A that is coupled to the negative reference voltage input terminal 226, via the resistor 314, and a terminal 308B that is coupled to the negative reference voltage feedback terminal 236, via the resistor 316.

The switch 310 couples the reference voltage node 222 to a common voltage source, such as ground. The switch 310 includes a terminal 310A that is coupled to the reference voltage node 222 and a terminal 310B that is coupled to a common voltage source, such as ground.

The resistor 318 couples the switch 302, the switch 306, and the reference voltage node 222 to ground. The resistor 318 includes a terminal 318A that is coupled to the terminal 302B of the switch 302, the terminal 306B of the switch 306, and the reference voltage node 222, and includes a terminal 318B that is coupled to a common voltage source, such as ground.

The capacitor 320 is connected in parallel with the resistor 318. The capacitor 320 includes a terminal 320A that is coupled to the terminal 318A of the resistor 318, and includes a terminal 320B that is coupled to a common voltage source, such as ground.

The diode 322 is connected in parallel with the resistor 318. The diode 322 ensures that the voltage at the reference voltage node 222 does not rise above the voltage at the common voltage source (e.g., zero volts). The diode 322 includes an anode terminal 322A that is coupled to the terminal 318A of the resistor 318, and includes a cathode terminal 322B that is coupled to a common voltage source.

The switch 302, switch 304, switch 306, switch 308, and switch 310 are controlled by the signals 240 generated by the power-up control circuit 232. During a power-up interval, the signals 240 close the switch 310 for a time to force the reference voltage node 222 to the voltage at the common voltage source. While the switch 310 is closed, the switch 302, the switch 304, the switch 306, and the switch 308 may be open. After the switch 310 is opened, the switch 306 may be closed to slowly charge the reference voltage node 222 through the resistor 312, and the switch 308 may be closed to provide feedback to the operational amplifier 106. While the reference voltage node 222 is slowly charging via the switch 306, the switch 302 and the switch 304 are open to protect the switch 218 from transients generated by the operational amplifier 106. After the reference voltage node 222 is charged (partially or fully charged) the switch 302 and the switch 304 may be closed, and the switch 308 may be opened.

Figure 4:
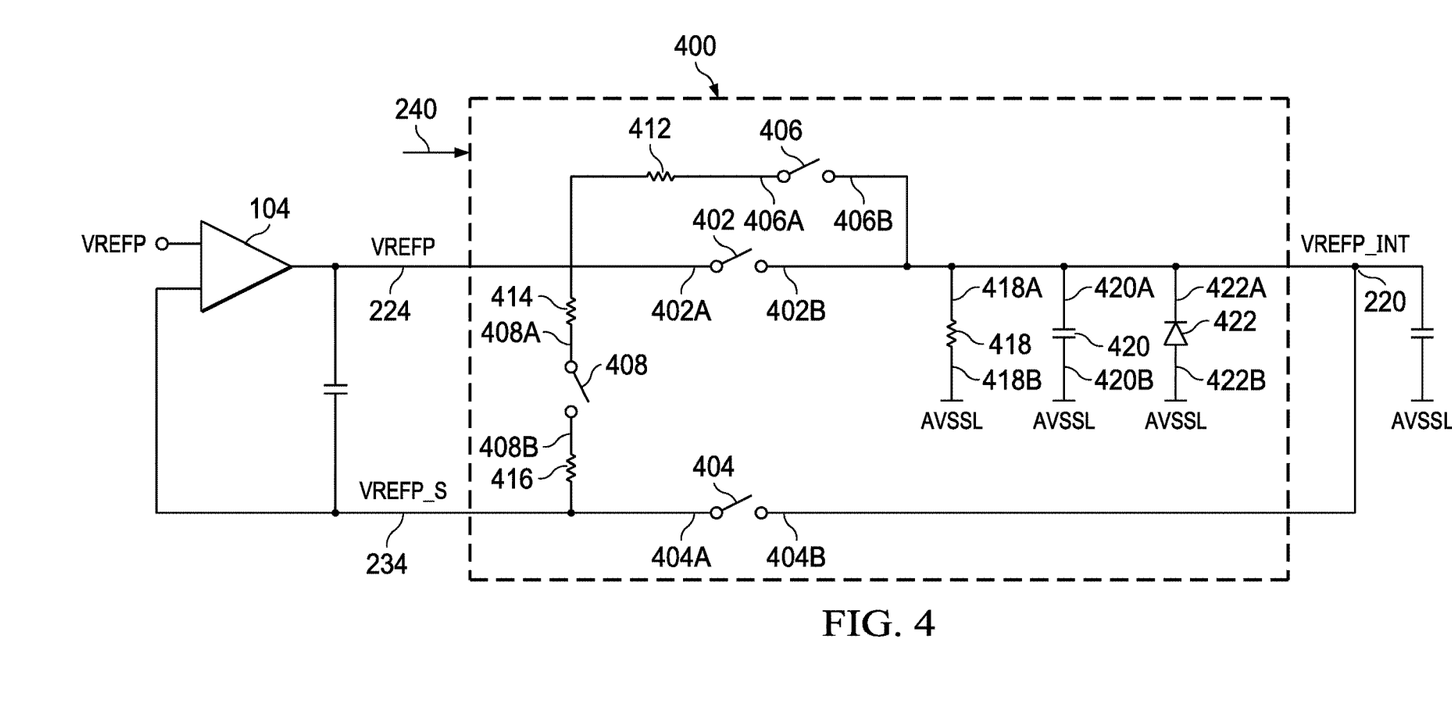
FIG. 4 shows a block diagram for an example protection circuit for a high-side reference voltage in accordance with the present disclosure.

FIG. 4 shows a block diagram for an example protection circuit 400 for a high-side reference voltage in accordance with the present disclosure. The protection circuit 400 is an implementation of the protection circuit 228. The protection circuit 400 includes switch 402, switch 404, switch 406, switch 408, resistor 412, resistor 414, resistor 416, resistor 418, capacitor 420, and diode 422. The switches 402-408 are controlled by the signals 240 generated by the power-up control circuit 232.

The switch 402 couples the positive reference voltage input terminal 224 to the reference voltage node 220. The switch 404 couples the positive reference voltage feedback terminal 234 to the reference voltage node 220. The switch 402 includes a terminal 402A that is coupled to the positive reference voltage input terminal 224 and a terminal 402B that is coupled to the reference voltage node 220. The switch 404 includes a terminal 404A that is coupled to the positive reference voltage feedback terminal 234 and a terminal 404B that is coupled to the reference voltage node 220. The switch 406 couples the positive reference voltage input terminal 224 to the reference voltage node 220 via the resistor 412, which is connected in series with the switch 406. The switch 406 includes a terminal 406A that is coupled to the positive reference voltage input terminal 224, via the resistor 412, and a terminal 406B that is coupled to the reference voltage node 220.

The switch 408 provides a path for feedback from the positive reference voltage input terminal 224 to the positive reference voltage feedback terminal 234 via the resistor 414 and resistor 416, which are connected in series with the switch 408. The switch 408 includes a terminal 408A that is coupled to the positive reference voltage input terminal 224, via the resistor 414, and a terminal 408B that is coupled to the positive reference voltage feedback terminal 234, via the resistor 416.

The resistor 418 couples the switch 402, the switch 406, and the reference voltage node 220 to ground. The resistor 418 includes a terminal 418A that is coupled to the terminal 402B of the switch 402, the terminal 406B of the switch 406, and the reference voltage node 220, and includes a terminal 418B that is coupled to a common voltage source, such as ground.

The capacitor 420 is connected in parallel with the resistor 418. The capacitor 420 includes a terminal 420A that is coupled to the terminal 418A of the resistor 418, and includes a terminal 420B that is coupled to a common voltage source.

The diode 422 is connected in parallel with the resistor 418. The diode 322 ensures that the voltage at the reference voltage node 220 does not fall below the voltage at the common voltage source (e.g., zero volts). The diode 422 includes a cathode terminal 422A that is coupled to the terminal 418A of the resistor 418, and includes an anode terminal 422B that is coupled to a common voltage source.

The switch 402, switch 404, switch 406, and switch 408 are controlled by the signals 240 generated by the power-up control circuit 232. During a power-up interval, the signals 240 close the switch 306 to slowly charge the reference voltage node 220 through the resistor 412, and close the switch 408 to provide feedback to the operational amplifier 106. While the reference voltage node 220 is slowly charging via the switch 406, the switch 402 and the switch 404 are open to protect the switch 216 from transients generated by the operational amplifier 104. After the reference voltage node 220 is charged (partially or fully charged) the switch 402 and the switch 404 may be closed, and the switch 408 may be opened.

Figure 5:
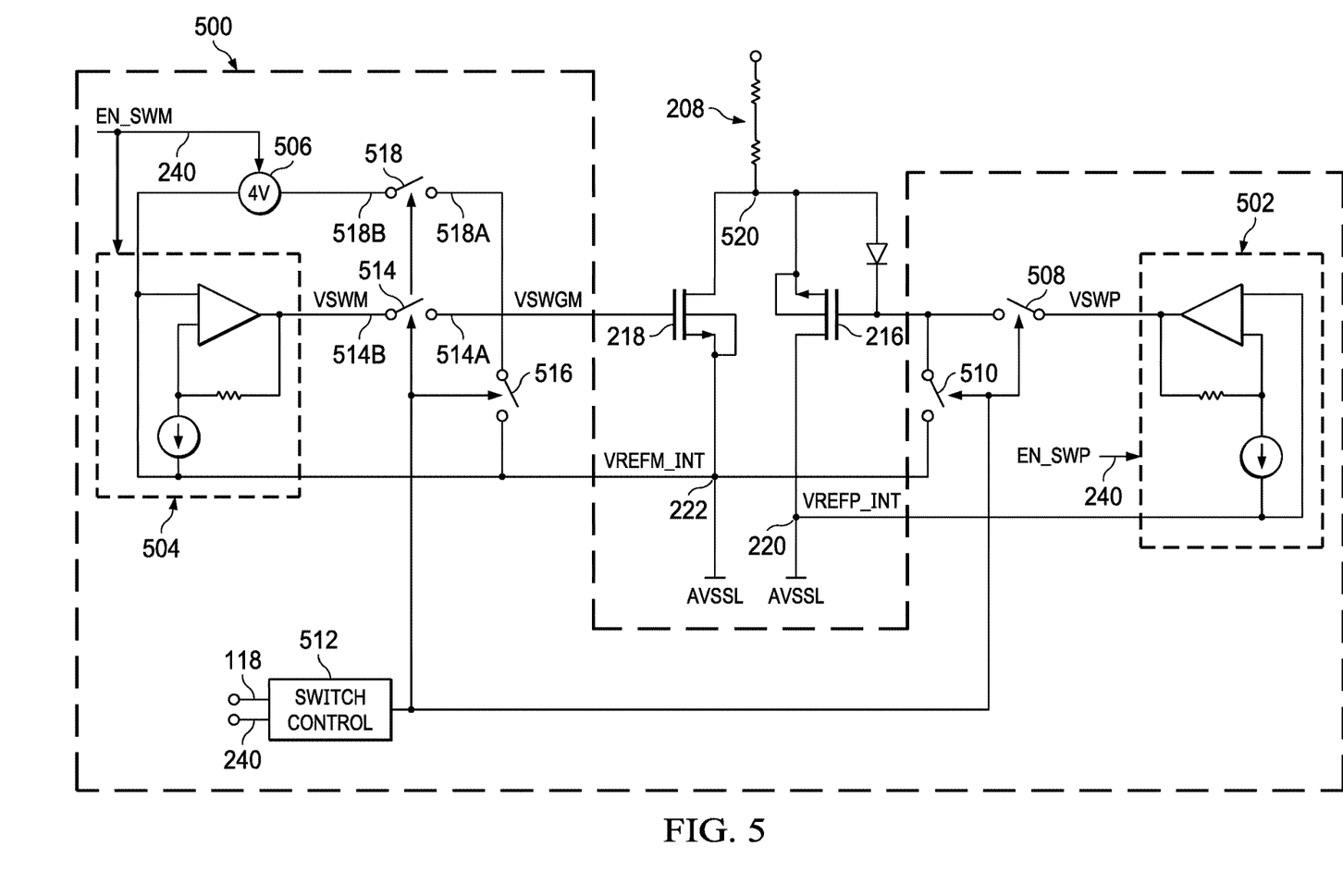
FIG. 5 shows a block diagram for an example reference voltage generation circuit in accordance with the present disclosure.

FIG. 5 shows a block diagram for an example reference voltage generation circuit 500 in accordance with the present disclosure. The reference voltage generation circuit 500 is an implementation of the switch regulator circuitry 238. FIG. 5 also shows a rung 208, a switch 216, and a switch 218 for reference. The reference voltage generation circuit 500 includes a voltage regulation circuit 502, voltage regulation circuit 504, and a voltage regulation circuit 506. The voltage regulation circuit 502 generates a voltage for closing the switch 216 (e.g., turning on the transistor that forms the switch 216). The switch 508 connects the switch 216 to the voltage regulation circuit 502 to close the switch 216, and the switch 510 connects the switch 216 to the reference voltage node 222 to open the switch 216. The switch control circuitry 512 controls the opening and closing of the switch 508 and the switch 510 based on the digital value 118.

The voltage regulation circuit 504 generates a voltage for closing the switch 218 (e.g., turning on the transistor that forms the switch 218). For example, the voltage regulation circuit 504 may generate a voltage that is higher than voltage at the reference voltage node 222 by a predetermined amount (e.g., 2 volts higher than the voltage at the reference voltage node 222). The switch 514 connects the switch 218 to the voltage regulation circuit 504 to close the switch 218, and the switch 516 connects the switch 218 to the reference voltage node 222 to open the switch 218. The switch 514 includes a terminal 514A that is coupled to the switch 218, and includes a terminal 514B that is coupled to the voltage regulation circuit 504. The switch control circuitry 512 controls the opening and closing of the switch 514 and the switch 516 based on the digital value 118 and the signals 240.

The voltage regulation circuit 506 also generates a voltage for closing the switch 218 (e.g., turning on the transistor that forms the switch 218). For example, the voltage regulation circuit 504 may generate a voltage that is higher than voltage at the reference voltage node 222 by a predetermined amount (e.g., 4 volts higher than the voltage at the reference voltage node 222). The switch 518 connects the switch 218 to the voltage regulation circuit 506 to close the switch 218. The switch 518 includes a terminal 518A that is coupled to the switch 218, and includes a terminal 518B that is coupled to the voltage regulation circuit 506. The switch control circuitry 512 controls the opening and closing of the switch 518 based on the signals 240. The voltage regulation circuit 506 ramps up to a voltage suitable for controlling the 218 more quickly than the voltage regulation circuit 504 ramps up to a suitable control voltage.

When the DAC 200 is powering up, the switch control circuitry 512 closes the switch 518 and opens the switch 514 while the voltage regulation circuit 504 is ramping up. Thus, a single instance of the voltage regulation circuit 506 controls all the switches 218 during power-up of the DAC 200. Closing the switch 218 during power-up pulls the node 520 down to the voltage at the reference voltage node 222, which protects the switch 216 from damage, and prevents transient generation at the output 116 of the DAC 200. After power-up, the switch control circuitry 512 closes the switch 514 and opens the switch 518 to allow the voltage regulation circuit 504 to control the switch 218. The switch 518 may be implemented using a high voltage positive MOS transistor.

Figure 6:
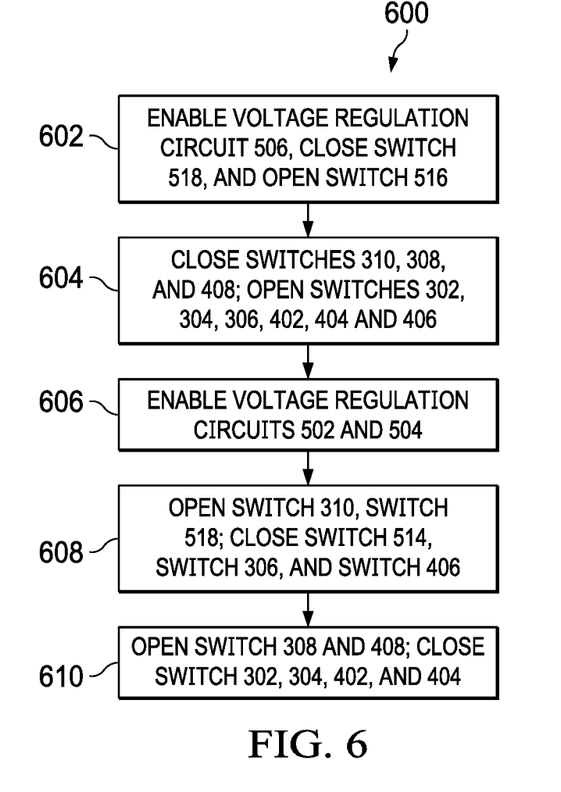
FIG. 6 shows a flow diagram for a method for powering up a digital-to-analog converter in accordance with the present disclosure.

FIG. 6 shows a flow diagram for a method 600 for powering up a DAC in accordance with the present disclosure. Though depicted sequentially as a matter of convenience, at least some of the actions shown can be performed in a different order and/or performed in parallel. Additionally, some implementations may perform only some of the actions shown. Operations of the method 600 may be performed by the DAC 200, and are explained by reference to the example timing diagram of FIG. 7.

Figure 7:
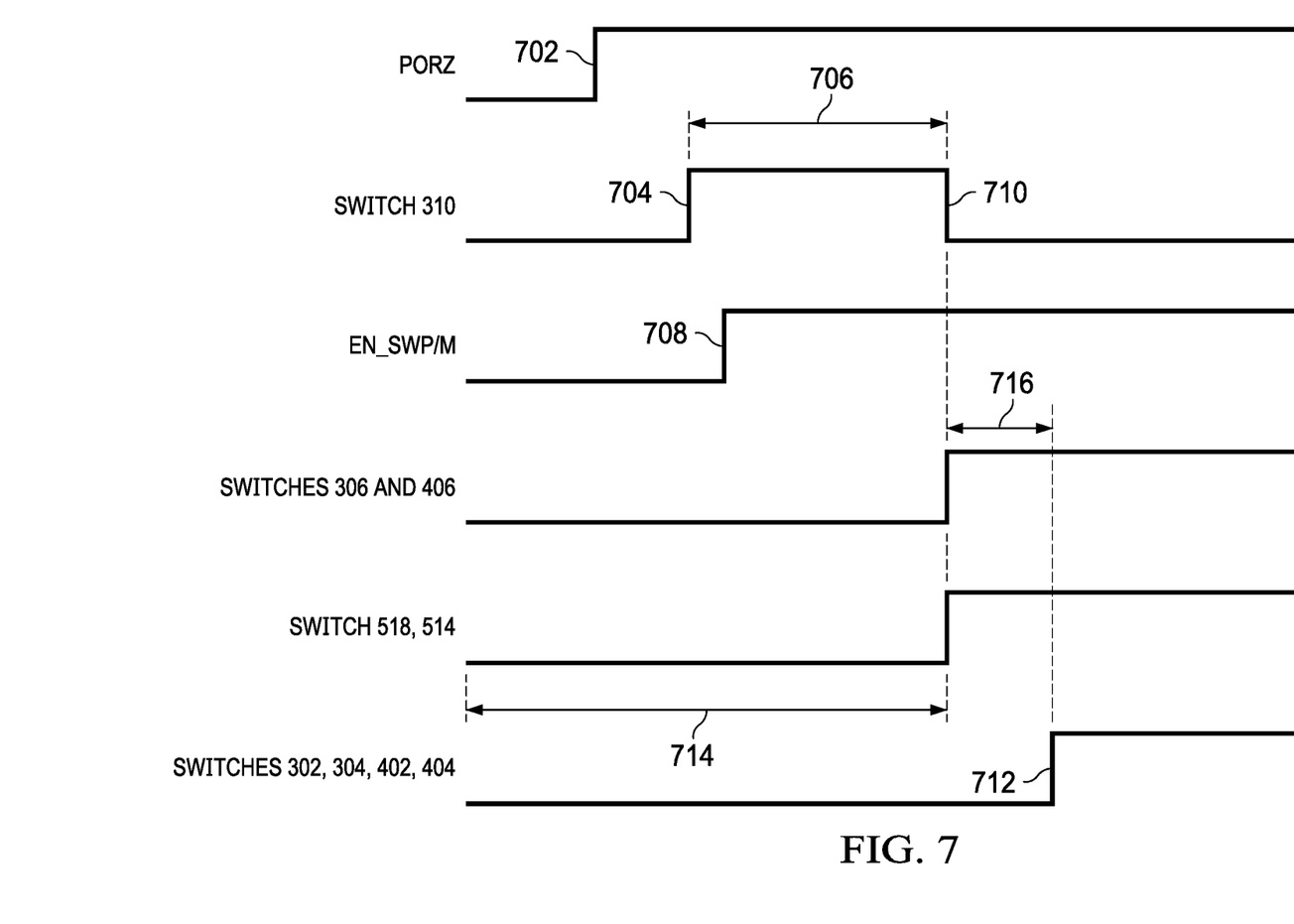
FIG. 7 shows an example timing diagram for power-up control of the protection circuits and reference voltage generation circuit of a digital-to-analog converter in accordance with the present disclosure.

In block 602, the DAC 200 is powering up. At time 702, the voltages powering the DAC 200 have ramped up to a level that allows the circuitry of the power-up control circuit 232 to recognize that the DAC 200 is being powered up. As the DAC 200 is powering up, in the interval 714, the power-up control circuit 232 enables the voltage regulation circuit 506 to generate control voltage for the switch 218, and the power-up control circuit 232 causes the switch 518 to close and the switch 514 to open (e.g., the signals 240 causes the switch control circuitry 512 to open the switch 21/1 and close the switch 218), thereby allowing the voltage regulation circuit 506 to control (close) the switch 218.

In block 604, at time 704, the power-up control circuit 232 closes the switch 310 to pull the reference voltage node 222 to ground, and closes the switch 308 and the switch 408 to provide a path for feedback to the operational amplifier 104 and the operational amplifier 106. The power-up control circuit 232 opens the switch 302, the switch 304, the switch 306, the switch 402, the switch 404, and the switch 406.

In block 606, at time 708, the power-up control circuit 232 enables the voltage regulation circuit 502 and the voltage regulation circuit 504 to generate control voltages for the switch 216 and switch 218. The switch 508 and the switch 514 remain open during the interval 706.

In block 608, at time 710, the power-up control circuit 232 opens the switch 310. The voltage regulation circuit 502 and the voltage regulation circuit 504 have ramped up to the desired control voltage for the switch 216 and switch 218. The power-up control circuit 232 opens the switch 518 and closes the switch 514 to allow the voltage regulation circuit 504 to control the switch 218. The power-up control circuit 232 closes the switch 306 and the switch 406 to initiate charging of the reference voltage node 220 and the reference voltage node 222. The voltage regulation circuit 506 is disabled.

In block 610, at time 712, the power-up control circuit 232 opens the switch 308 and the switch 408, and closes the switch 302, the switch 304, the switch 402, and the switch 404. Thus, in the power-up interval 716, the reference voltage node 220 and the reference voltage node 222 are slowly charged via the switches switch 306 and switch 406, and at the end of the power-up interval 716, the switch 302, the switch 304, the switch 402, and the switch 404 are closed, and the switch 308 and switch 408 are opened.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A digital-to-analog converter, comprising:
   a resistor ladder, the resistor ladder comprising:
      a rung having a first terminal and a second terminal;
   a first switch comprising:
      a first terminal coupled to the second terminal of the rung; and
      a second terminal coupled to a first reference voltage;
   a protection circuit coupled to the first reference voltage and to a reference voltage input, the protection circuit comprising:
      a second switch comprising:
         a first terminal coupled to the first reference voltage; and
         a second terminal coupled to the first reference voltage input;
      a third switch comprising:
         a first terminal coupled to the first reference voltage; and
         a second terminal coupled to a second reference voltage;
      a fourth switch comprising:
         a first terminal coupled to the reference voltage input; and
         a second terminal coupled to the second reference voltage.

2. The digital-to-analog converter of claim 1, wherein the protection circuit further comprises:
   a fifth switch comprising:
      a first terminal coupled to the first terminal of the second switch; and
      a second terminal coupled to the second terminal of the second switch; and
   a resistor in series with the fifth switch.

3. The digital-to-analog converter of claim 1, wherein the protection circuit further comprises a sixth switch comprising:
   a first terminal coupled to the first terminal of the second switch; and
   a second terminal coupled to a common voltage source.

4. The digital-to-analog converter of claim 1, wherein the protection circuit further comprises:
   a resistor comprising:
      a first terminal coupled to the first terminal of the second switch;
      a second terminal coupled to a common voltage source;
   a diode comprising:
      an anode terminal coupled to the first terminal of the resistor; and
      a cathode terminal coupled to the common voltage source; and
   a capacitor comprising:
      a first terminal coupled to the first terminal of the resistor; and
      a second terminal coupled to the common voltage source.

5. The digital-to-analog converter of claim 1, further comprising a resistor in series with the fourth switch.

6. The digital-to-analog converter of claim 1, wherein:
   the reference voltage input is a first reference voltage input;
   the protection circuit is a first protection circuit; and
   the digital-to-analog converter further comprises
      a fifth switch comprising:
         a first terminal coupled to the second terminal of the rung; and
         a second terminal coupled to a third reference voltage; and
      a second protection circuit coupled to the third reference voltage and to a second reference voltage input, the second protection circuit comprising:
         a sixth switch comprising:
            a first terminal coupled to the third reference voltage; and
            a second terminal coupled to the second reference voltage input;
         a seventh switch comprising:
            a first terminal coupled to the third reference voltage; and
            a second terminal coupled to a fourth reference voltage;
         an eighth switch comprising:
            a first terminal coupled to the second reference voltage input; and
            a second terminal coupled to the fourth reference voltage.

7. The digital-to-analog converter of claim 6, wherein the second protection circuit comprises:
   a ninth switch comprising:
      a first terminal coupled to the first terminal of the sixth switch; and
      a second terminal coupled to the second terminal of the sixth switch; and
   a first resistor in series with the ninth switch;
   a second resistor in series with the eighth switch;
   a third resistor comprising:
      a first terminal coupled to the first terminal of the sixth switch;
      a second terminal coupled to a common voltage source;
   a diode comprising:
      an anode terminal coupled to the first terminal of the third resistor; and
      a cathode terminal coupled to the common voltage source; and
   a capacitor comprising:
      a first terminal coupled to the first terminal of the third resistor; and
      a second terminal coupled to the common voltage source.

8. The digital-to-analog converter of claim 1, further comprising:
   a first voltage regulation circuit;
   a fifth switch comprising:
      a first terminal coupled to a third terminal of the first switch;
      a second terminal coupled to an output of the first voltage regulation circuit;
   a second voltage regulation circuit; and
   a sixth switch comprising:
      a first terminal coupled to the third terminal of the first switch;
      a second terminal coupled to an output of the second voltage regulation circuit.

9. An integrated circuit, comprising:
   a digital-to-analog converter, comprising:
      a resistor ladder;
      a first switch coupled between a first reference voltage and a rung of the resistor ladder;
      a second switch coupled between a second reference voltage and the rung of the resistor ladder;

a first reference voltage input configured to receive a first reference voltage;
a second reference voltage input configured to receive a second reference voltage;
a first protection circuit coupled to the first reference voltage and the first reference voltage input, and comprising:
   a third switch coupled between the first reference voltage and the first reference voltage input through a first resistor; and
   a fourth switch coupled between the first reference voltage and the first reference voltage input;
a second protection circuit coupled to the second reference voltage and the second reference voltage input, and comprising:
   a fifth switch coupled between the second reference voltage and the second reference voltage input terminal through a second resistor; and
   a sixth switch coupled between the second reference voltage and the second reference voltage; and
power-up control circuitry configured to:
   close the third switch and the fifth switch during a power-up interval;
   open the fourth switch and the sixth switch during the power-up interval; and
   close the fourth switch and the sixth switch after expiration of the power-up interval.

10. The integrated circuit of claim 9, wherein:
the first protection circuit further comprises a seventh switch coupled between the first reference voltage input and a first reference voltage feedback terminal through a third resistor;
the second protection circuit further comprises an eighth switch coupled between the second reference voltage input and a second reference voltage feedback terminal through a fourth resistor; and
the power-up control circuitry is configured to:
   close the seventh switch and the eighth switch during the power-up interval; and
   open the seventh switch and the eighth switch after expiration of the power-up interval.

11. The integrated circuit of claim 9, wherein:
the first protection circuit further comprises a seventh switch coupled between the first reference voltage between a first reference voltage feedback terminal;
the second protection circuit further comprises an eighth switch coupled between the second reference voltage and a second reference voltage feedback terminal; and
the power-up control circuitry is configured to:
   open the seventh switch and the eighth switch during the power-up interval; and
   close the seventh switch and the eighth switch after expiration of the power-up interval.

12. The integrated circuit of claim 9, wherein:
the first protection circuit further comprises a seventh switch coupled between the first reference voltage and a common voltage source;
the power-up interval is a first power-interval; and
the power-up control circuitry is configured to:
   close the seventh switch during a second power-up interval that precedes the first power-up interval; and
   open the seventh switch prior to closure of the first switch.

13. The integrated circuit of claim 9, wherein:
the first protection circuit further comprises a third resistor coupled between the first reference voltage and a common voltage source; and
the second protection circuit further comprises a fourth resistor coupled between the first reference voltage and a common voltage source.

14. The integrated circuit of claim 9, further comprising:
a first voltage regulation circuit configured to generate a first voltage to control the first switch;
a second voltage regulation circuit configured to generate a second voltage to control the first switch;
a seventh switch coupled between the first voltage regulation circuit and the first switch; and
an eighth switch coupled between the second voltage regulation circuit and the first switch;
wherein the power-up interval is a first power-interval; and
the power-up control circuitry is configured to:
   close the seventh switch during a second power-up interval that precedes the first power-up interval;
   open the seventh switch at an end of the second power-up interval; and
   close the eighth switch at the end of the second power-up interval.

15. A method, comprising:
in a digital-to-analog converter comprising a resistor ladder, a first switch coupled between a first reference voltage and a rung of the resistor ladder, and a second switch coupled between a second reference voltage and the rung of the resistor ladder:
   closing, in a power-up interval:
      a third switch to couple the first reference voltage to a first reference voltage input through a first resistor; and
      a fourth switch to couple the second reference voltage to a second reference voltage input through a second resistor;
   opening, in the power-up interval:
      a fifth switch that couples the first reference voltage to the first reference voltage input; and
      a sixth switch that couples the second reference voltage to the second reference voltage input; and
   closing, after expiration of the power-up interval, the fifth switch and the sixth switch.

16. The method of claim 15, further comprising:
closing, in the power-up interval:
   a seventh switch that couples the first reference voltage input to a first reference voltage feedback terminal through a third resistor; and
   an eighth switch that couples the second reference voltage input to a second reference voltage feedback terminal through a fourth resistor; and
opening the seventh switch and the eighth switch after expiration of the power-up interval.

17. The method of claim 15, further comprising:
opening, in the power-up interval:
   a seventh switch that couples the first reference voltage to a first reference voltage feedback terminal; and
   an eighth switch that couples the second reference voltage to a second reference voltage feedback terminal; and
closing the seventh switch and the eighth switch after expiration of the power-up interval.

18. The method of claim 15, wherein the power-up interval is a first power-up interval, and the method further comprises:
closing, in a second power-up interval that precedes the first power-up interval, a seventh switch that couples the first reference voltage to a common voltage source; and opening the seventh switch after expiration of the second power-up interval.

19. The method of claim 15, wherein the power-up interval is a first power-up interval, and the method further comprises:
   in a second power-up interval the precedes the first power-up interval:
      closing a seventh switch that couples a first voltage regulator circuit to the first switch; and
      opening an eighth switch that couples a second voltage regulator circuit to the first switch; and
   at an end of the second power-up interval:
      opening the seventh switch; and
      closing the eighth switch.

20. The method of claim 15, further comprising providing, by the first voltage regulation circuit, a first voltage sufficient to close the first switch prior to providing, by the second voltage regulation circuit, a second voltage sufficient to close the first switch.

\* \* \* \* \*